United States Patent
Johnson et al.

(10) Patent No.: US 6,717,832 B2
(45) Date of Patent: Apr. 6, 2004

(54) METHOD FOR DATA COMMUNICATION BETWEEN A PLURALITY OF SEMICONDUCTOR MODULES AND A CONTROLLER MODULE AND SEMICONDUCTOR MODULE CONFIGURED FOR THAT PURPOSE

(75) Inventors: Bret Johnson, München (DE); Aaron Nygren, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/208,444

(22) Filed: Jul. 29, 2002

(65) Prior Publication Data

US 2003/0021137 A1 Jan. 30, 2003

(30) Foreign Application Priority Data

Jul. 27, 2001 (DE) .......................... 101 36 853

(51) Int. Cl.[7] ................................................ G11C 5/02
(52) U.S. Cl. ......................................... 365/52; 365/191
(58) Field of Search ........................ 365/52, 233, 191, 365/193

(56) References Cited

U.S. PATENT DOCUMENTS

| | | | | |
|---|---|---|---|---|
| 5,621,685 A | * | 4/1997 | Cernea et al. | ......... 365/185.18 |
| 6,009,494 A | | 12/1999 | Pawlowski | |
| 6,393,504 B1 | * | 5/2002 | Leung et al. | ................ 710/104 |

FOREIGN PATENT DOCUMENTS

DE 197 34 554 A1 2/1999

* cited by examiner

Primary Examiner—Thong Q. Le
(74) Attorney, Agent, or Firm—Laurence A. Greenberg; Werner H. Stemer; Ralph E. Locher

(57) ABSTRACT

A communications method is described in which two memory modules receive data and commands from a controller module via a common data and command bus. The memory modules contain active line terminations. By a second chip select input, one of the memory modules can monitor the write commands that pass from the controller module to the other memory module, and thus activate the line terminal in the monitoring memory module.

7 Claims, 3 Drawing Sheets

METHOD FOR DATA COMMUNICATION BETWEEN A PLURALITY OF SEMICONDUCTOR MODULES AND A CONTROLLER MODULE AND SEMICONDUCTOR MODULE CONFIGURED FOR THAT PURPOSE

BACKGROUND OF THE INVENTION

Field of the Invention

The invention relates to a method for communication between a plurality of semiconductor modules, in particular semiconductor memory modules, and a controller module via a common bus system. A respective semiconductor module is selected and activated by the controller module by an appropriate command and a respective chip select signal fed separately to the semiconductor modules. The invention also relates to a semiconductor module, in particular a semiconductor memory module, which is configured for this purpose.

SUMMARY OF THE INVENTION

It is accordingly an object of the invention to provide a method for data communication between a plurality of semiconductor modules and a controller module and a semiconductor module configured for that purpose that overcome the disadvantages of the prior art devices and methods of this general type, in which time conflicts and the resulting reduction in the bus efficiency and the data throughput rate are avoided.

With the foregoing and other objects in view there is provided, in accordance with the invention, a method for communicating between a controller module and memory modules, including a first memory module and a second memory module, through a common bus system. The method includes outputting from the controller module a command signal and chip select signals including a first chip select signal and a second chip select signal fed to the memory modules for selecting a respective memory module. The first memory module receives both the first chip select signal and the second chip select signal and the second memory module receives the second chip select signal. A bus signal line termination is activated for terminating data to be transmitted from the controller module to both of the memory modules only in the first memory module as soon as the first memory module functioning as a monitoring memory module registers one of the chip select signals.

In the communications method according to the invention, one of the memory modules can monitor the chip select signal sent by the controller module to another semiconductor module, and to itself and activate its own signal line termination if it has detected the chip select signal.

As a result of the monitoring semiconductor module monitoring, at its second chip select input, the chip select signal which is fed to the other semiconductor module, the monitoring semiconductor module can listen in to the commands sent to the adjacent module and distinguish them from "its own" commands sent to it by the controller module. The monitoring makes it possible for the one memory module to carry out functions that are based on the activity in the second semiconductor module. By virtue of the fact that one of the two semiconductor modules forms the active signal termination for both semiconductor modules, the time conflict described above and the pause in the data stream can be eliminated.

So that the active line termination can be applied with correct timing, the monitoring module must know when the monitored semiconductor module has received a write command. This information can be determined by linking to the chip select input of the monitored semiconductor module the command signals that are fed jointly to the two semiconductor modules by the controller module. In this way, the monitoring semiconductor module knows when the monitored memory module has received a write command, and can thus activate the line termination, or if it is already activated, leave the line termination activated. As a result, the time conflict brought about by the switching over of the line termination on the data bus can be avoided if the switching over of the respective memory module addressed for the write data takes the form of switching from the first memory module to the second or from the second memory module to the first.

The additional expenditure on circuitry which is necessary in the semiconductor modules in order to carry out the method according to the invention is minimal as the reaction of the monitoring semiconductor module to the write command for the monitored semiconductor module is part of the normal activity of the monitoring module in reaction to its own write command. Thus, each semiconductor module needs, apart from the additional second chip select input for linking it to the write command, that is to say for the chip select monitoring circuit, only a second copy of internal circuit units which are already present in the semiconductor module.

With the foregoing and other objects in view there is provided, in accordance with the invention, a semiconductor memory module. The memory module contains an interface circuit for receiving data and commands from a common controller module via a common bus system configured for connecting two such semiconductor memory modules to the controller module. The interface includes an active line termination circuit, a first chip select input provided for selecting a respective memory module by the controller module, a first chip select monitoring circuit connected to the first chip select input, a second chip select input, and a second chip select monitoring circuit connected to the second chip select input. It being possible to connect the second chip select input to a first chip select input of a second memory module, and after the second chip select monitoring circuit registers a chip select signal received at the second chip select input the second chip select monitoring circuit activates the active line termination circuit to perform a line termination of data signals transmitted by the common controller module.

In accordance with an added feature of the invention, the semiconductor memory module is a SDRAMs or a SGRAM.

In accordance with another feature of the invention, the interface has a programmable mode register into which it is possible to program information indicating if the second chip select monitoring circuit monitors the second chip select input, and if the active line termination circuit is activated in response to receiving the chip select signal in the second chip select monitoring circuit.

Other features which are considered as characteristic for the invention are set forth in the appended claims.

Although the invention is illustrated and described herein as embodied in a method for data communication between a plurality of semiconductor modules and a controller module and a semiconductor module configured for that purpose, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
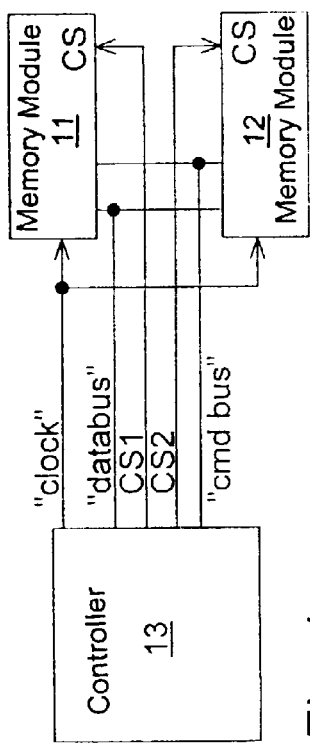
FIG. 1 is a block diagram of a known configuration of two memory modules that can be written to by a controller module via a common data and command bus.

Referring now to the figures of the drawing in detail and first, particularly, to FIG. 1 thereof, there is shown a known method by which a first and a second identical semiconductor module 11 and 12 can be addressed, for the purpose of transmitting commands and data signals, by a controller 13 via a common bus system. The bus system contains data bus lines "data bus" and command bus lines "CMD bus", the data bus lines containing both data lines and data strobe lines if the semiconductor modules 11 and 12 are memories that can be operated in a double data rate (DDR) mode. The controller module 13 also feeds a clock signal "clock" to the first and second memory modules 11 and 12.

The controller module 13 also generates chip select signals CS1 and CS2 that are each fed to a chip select input CS of the first and second memory modules 11 and 12. A command signal is interpreted as valid by the semiconductor modules 11, 12 if a predetermined bit pattern is linked to a valid chip signal via the command bus lines, and the clock signal changes from low to high.

Figure 2:
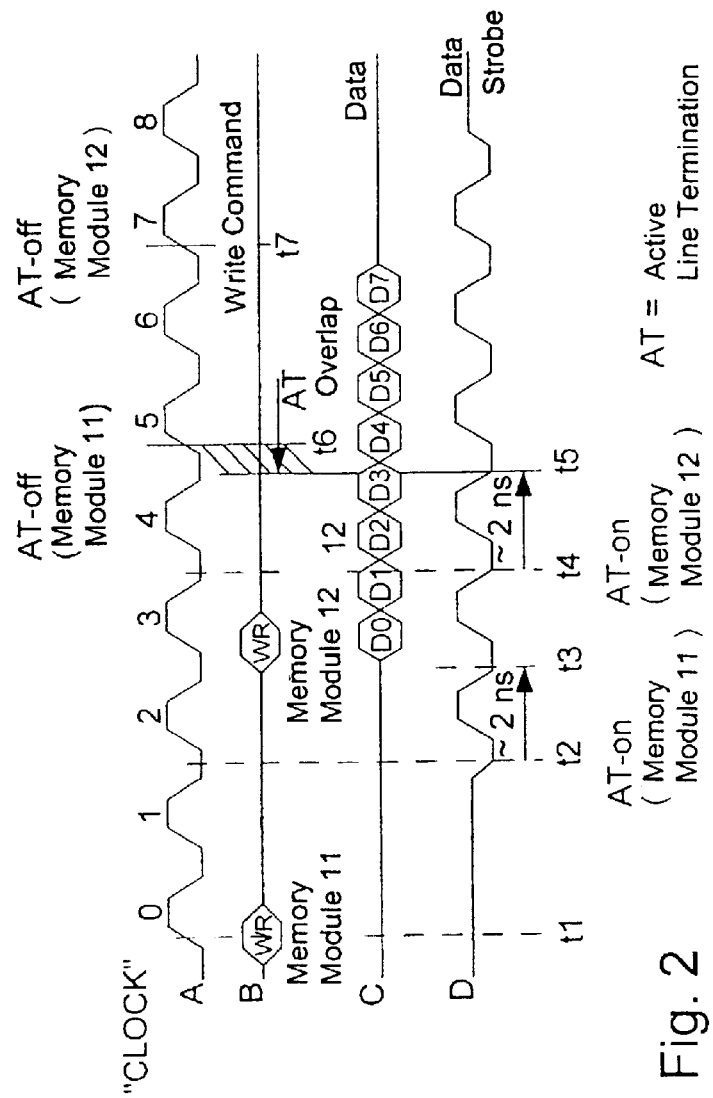
FIG. 2 is a timing diagram for writing into both memory modules shown in FIG. 1.

The signal time diagram illustrated in FIG. 2 represents the mode of operation when data is written by the controller module 13 into the two semiconductor modules that are, for example, the memory modules 11 and 12. In the top line A of the signal time diagram in FIG. 2 the clock signal "clock" is represented which is generated by the controller 13 and fed to the two memory modules 11 and 12. Nine successive clock pulses 0–8 are shown. At a time t1, a write command WR is sent to the first memory module 11 via the command bus "CMD bus" (line B). Line D shows that approximately 2 ns after the first data strobe signal pulse (time t2), a line termination AT of the first memory module 11 is activated at the time t3, which line termination AT is switched off with the front edge of the sixth clock pulse 5 (time t6). With the front edge of the fourth clock pulse 3, a write command WR is sent from the controller 13 to the second memory module 12. Two nanoseconds after the third data strobe signal pulse starting at the time t4, the second memory module 12 can activate the line termination AT (AT-on), at the time t5. Between the times t5 and t6 there is an AT overlap as both memory modules 11 and 12 have activated their line termination in the time period. The second memory module 12 does not switch its line termination off (AT-off) until the time t7. Owing to the common data bus, the controller 13 can write data only into one of the two memory modules 11 or 12 at a time with a write command. The line termination AT that is necessary for this is activated in each case by the addressed memory module 11, 12 at the time t3 or t5, and the data D0 to D7 is then written into the first memory module 11 by the controller 13 (line C in FIG. 2).

If the controller module 13 writes data alternately into the two memory modules 11 and 12, an additional time period is required for the switching on of the active line termination AT in both memory modules 11 and 12 for the signal quality on the data lines not to be impaired. For this reason, the data stream must be interrupted by an added pause time interval, as a result of which the data throughput rate is reduced.

For this reason, the active line termination circuit implemented in more recent high-speed memory modules such as SDRAMs and SGRAMs has given rise to a time conflict that entails a reduction in the efficiency of the bus and in the data throughput rate.

Figure 3:
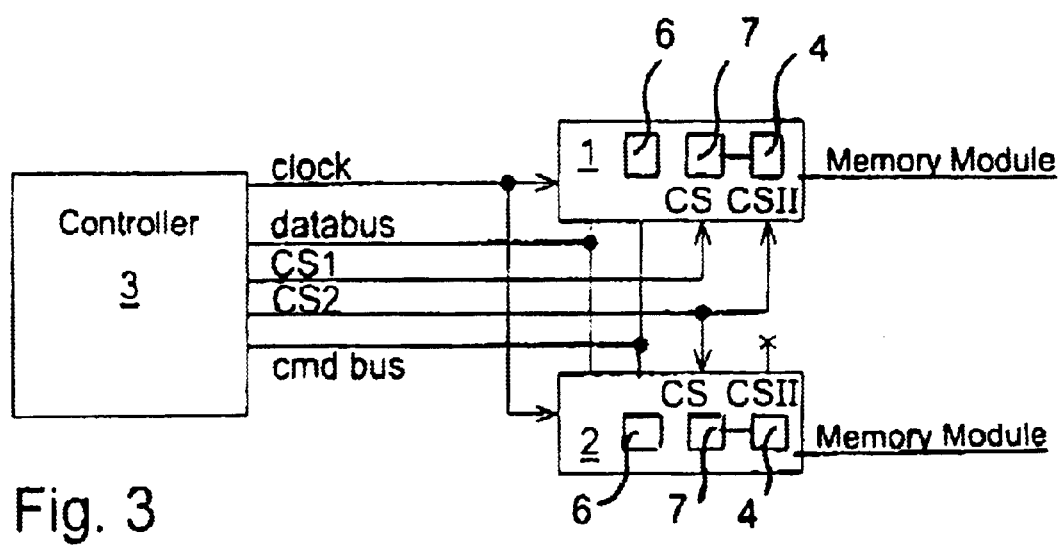
FIG. 3 is a block diagram of a new configuration of two memory modules which can be written to by a controller module according to the invention.

This problem is solved according to the invention and as shown in FIG. 3, each memory module 1, 2 has an additional second chip select input CSII. The second chip select input CSII of the first memory module 1 is connected to a first chip select input CS of the second memory module 2. For this reason, the first memory module 1 can monitor the write commands that are sent from the controller module 3 to the second memory module 2 via the command bus, and can distinguish them from its own commands received from the controller module 3. As a write command fed to the second memory module 2 by the controller module 3 via the command bus "CMD bus" is also present at the first memory module 1, a chip select monitoring circuit 4 in the first memory module 1 can carry out linking of the chip select signal CS2 present at the second chip select input CSII to the write command and as a result register the information that the line termination for terminating the data bus lines for the write data which is output by the controller module 3 via the data bus lines "data bus" for the memory module 2 is to be activated.

Each memory module 1 and 2 contains programmable mode registers 6 such as are customary in any SDRAM and which are set by the controller module 3 during the starting up of the system. The mode registers 6 can be used to define which of the memory modules 1 and 2 is the monitoring (first) memory module, and which is the monitored (second) memory module. The corresponding bit in the mode register can be considered to be an enable/disable bit for the functioning of an active line termination device 7 for active line termination. The second chip select input CSII of the second memory module 2 can either be disabled by the state of the mode register so that this input does not function or is connected to the nonselected logic level. In a non-illustrated system with only one memory module, the memory module is placed in the monitoring state and its second chip select input CS2 is connected to the nonselected logic level.

As the reaction of the first memory module 1 to the write command which is sent to the second memory module 2 constitutes a part of the normal activity of the first memory module 1 in reaction to a write command which applies to it, the expenditure on circuitry which is necessary to carry out the method apart from the additional second chip select input CSII is small because the main requirement is merely a copy of circuit units already present in the memory module.

Figure 4:
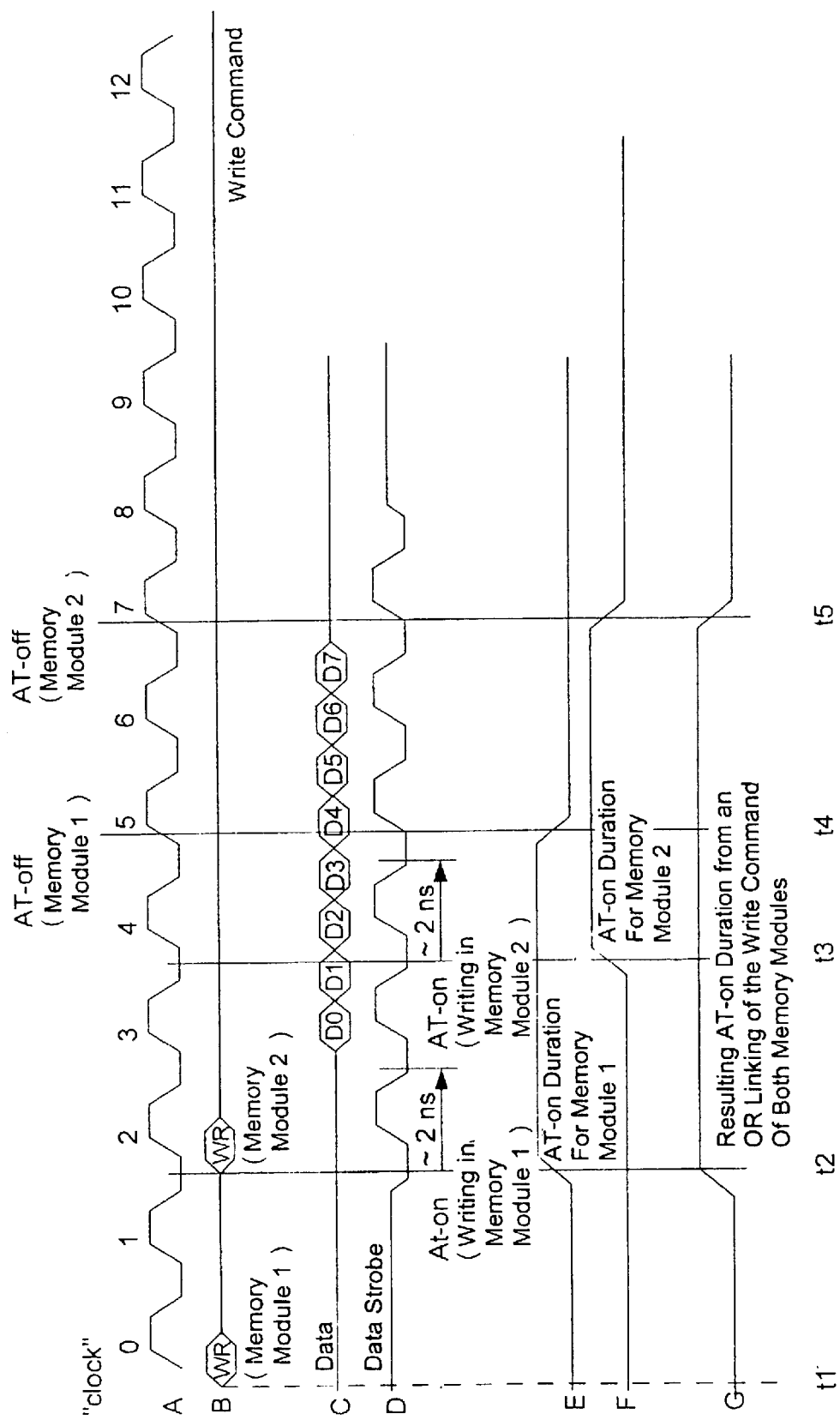
FIG. 4 is a timing diagram for explaining the method of operation when the two memory modules shown in FIG. 3 are written to by the controller module.

The timing diagram illustrated in FIG. 4 illustrates in more detail the mode of operation of the method according to the invention. The line A shows the clock signal "clock" fed to the two memory modules 1 and 2 by the controller module 3. Thirteen clock pulses 0–12 are represented in succession. Line B shows a first write command WR to the memory module 1 at the time t1 and a second write command (WR) to the memory module 2 at the time t2. At the same time as the write commands, the respectively associated chip select signals CS1, CS2 for the memory modules 1 and 2 are also output by the controller module 3, which are received by the memory modules 1 and 2 at their respective first chip select inputs CS. Line C shows the data D0–D7 to be written. Line D shows the data strobe pulses that are output in the DDR mode by the controller module 3 via the data bus lines "data bus". Line E gives the time period (AT-on) during which the active line termination (AT) in the first memory module 1 would be switched on if writing were to be carried out only into the memory module 1. Line F illustrates the activation time period (AT-on) of the active line termination (AT) if the write data were to be valid only for the second memory module 2. Line G finally shows the switch-on period (AT-on) of the active line termination AT which results from an OR linking of the write commands of the two memory modules 1, 2, the line termination AT being activated in the monitoring first memory module 1. The resulting switch-on period (AT-on) of the active line termination AT in the memory module 1 starts at the time t2 and ends at the time t5 after the last write data D7 has been written in by the controller 3 via the data bus.

We claim:

1. A method for communicating between a controller module and memory modules, including a first memory module and a second memory module, through a common bus system, which comprises the steps of:

outputting from the controller module a command signal and dedicated chip select signals including a first chip select signal and a second chip select signal fed to the memory modules for selecting a respective memory module, the first and second chip select signals being selectively outputted from the controller module independent from the command signal, the first memory module receiving both the first chip select signal and the second chip select signal and the second memory module receiving only the second chip select signal; and activating a bus signal line termination for terminating data to be transmitted from the controller module to both of the memory modules only in the first memory module as soon as the first memory module functioning as a monitoring memory module registers one of the chip select signals.

2. A semiconductor memory module, comprising:

an interface circuit for receiving data and commands from a common controller module via a common bus system configured for connecting two such semiconductor memory modules to the controller module, said interface including:

an active line termination circuit;

a first chip select input for receiving a dedicated chip select signal from said controller module for selecting a respective memory module by the controller module;

a first chip select monitoring circuit connected to said first chip select input;

a second chip select input for receiving another dedicated chip select signal from said controller module; and a second chip select monitoring circuit connected to said second chip select input, it being possible to connect said second chip select input to a first chip select input of a second memory module, and after said second chip select monitoring circuit registers said chip select signal received at said second chip select input said second chip select monitoring circuit activates said active line termination circuit to perform a line termination of data signals transmitted by the common controller module.

3. The semiconductor memory module according to claim 2, wherein the semiconductor memory module is selected from the group consisting of SDRAMs and SGRAM.

4. The semiconductor module according to claim 2, wherein said interface has a programmable mode register into which it is possible to program information indicating if said second chip select monitoring circuit monitors said second chip select input, and if said active line termination circuit is activated in response to receiving the chip select signal in said second chip select monitoring circuit.

5. A semiconductor memory configuration, comprising:

first and second chip select lines;

a controller module outputting first and second chip select signals on said first and second chip select lines, respectively, command signals, and data signals;

a first memory module having a first chip select input connected to said controller module for receiving the first chip select signal, a second chip select input connected to said controller module For receiving the second chip select signal, a chip select monitoring circuit connected to said second chip select input of said first memory module, and an active line termination circuit;

a second memory module having a first chip select input connected to said controller module, said first chip select input of said second memory module connected to said second chip select input of said first memory module; and a common bus system connecting said controller module, said first memory module and said second memory module to each other for providing the data signals and the command signals from said controller module to said first and second memory modules;

said chip select monitoring circuit of said first memory module registers a chip select signal received at said second chip select input of said first memory module and subsequently activates said active line termination circuit of said first memory module for performing a line termination of the data signals transmitted by said controller module.

6. The semiconductor memory configuration according to claim 5, wherein the first and second memory modules are selected from the group consisting of SDRAMs and SGRAM.

7. The semiconductor memory configuration according to claim 5, wherein each of said first memory module and said second memory module has a programmable mode register into which it is possible to program information indicating if said chip select monitoring circuit of a respective semiconductor module monitors said second chip select input, and it said active line termination circuit is activated in response to receiving the chip select signal in said chip select monitoring circuit.

* * * * *